United States Patent
Fujino et al.

(10) Patent No.: US 12,156,330 B2
(45) Date of Patent: Nov. 26, 2024

(54) LIGHT-TRANSMITTING ELECTROCONDUCTIVE FILM AND TRANSPARENT ELECTROCONDUCTIVE FILM

(71) Applicant: NITTO DENKO CORPORATION, Ibaraki (JP)

(72) Inventors: Nozomi Fujino, Osaka (JP); Taisuke Karasuda, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 139 days.

(21) Appl. No.: 17/912,170

(22) PCT Filed: Mar. 18, 2021

(86) PCT No.: PCT/JP2021/011153
§ 371 (c)(1),
(2) Date: Sep. 16, 2022

(87) PCT Pub. No.: WO2021/187578
PCT Pub. Date: Sep. 23, 2021

(65) Prior Publication Data
US 2023/0128838 A1    Apr. 27, 2023

(30) Foreign Application Priority Data

Mar. 19, 2020 (JP) ................................ 2020-049864
Apr. 20, 2020 (JP) ................................ 2020-074853
(Continued)

(51) Int. Cl.
*H05K 1/09* (2006.01)
*H05K 1/02* (2006.01)

(52) U.S. Cl.
CPC ............. *H05K 1/09* (2013.01); *H05K 1/0274* (2013.01)

(58) Field of Classification Search
CPC ............................... H05K 1/09; H05K 1/0274
See application file for complete search history.

(56) References Cited

U.S. PATENT DOCUMENTS 6,316,343 B1    11/2001    Wada et al.
6,617,056 B1    9/2003    Hara et al.
(Continued)

FOREIGN PATENT DOCUMENTS

CN    1302442 A    7/2001
CN    101027941 A    8/2007
(Continued)

OTHER PUBLICATIONS

Office Action dated Aug. 3, 2023, issued in CN application No. 202180022337.0 (counterpart to U.S. Appl. No. 17/912,182), with English translation. (14 pages).
(Continued)

*Primary Examiner* — Sherman Ng
(74) *Attorney, Agent, or Firm* — WHDA, LLP

(57) ABSTRACT

A light-transmitting electroconductive film (20) according to the present invention includes a region containing krypton at a content ratio of less than 0.1 atomic % at least partially in a thickness direction (D) of the light-transmitting electroconductive film (20). A transparent electroconductive film (X) according to the present invention includes a transparent substrate (10); and the light-transmitting electroconductive film (20) disposed on one surface side in the thickness direction (D) of the transparent substrate.

6 Claims, 5 Drawing Sheets

(30) Foreign Application Priority Data

| Date | Country | Number |
|---|---|---|
| Apr. 20, 2020 | (JP) | 2020-074854 |
| Aug. 7, 2020 | (JP) | 2020-134832 |
| Aug. 7, 2020 | (JP) | 2020-134833 |
| Aug. 21, 2020 | (JP) | 2020-140238 |
| Aug. 21, 2020 | (JP) | 2020-140239 |
| Aug. 21, 2020 | (JP) | 2020-140240 |
| Aug. 21, 2020 | (JP) | 2020-140241 |
| Sep. 4, 2020 | (JP) | 2020-149474 |
| Dec. 2, 2020 | (JP) | 2020-200421 |
| Dec. 2, 2020 | (JP) | 2020-200422 |

(56) References Cited

U.S. PATENT DOCUMENTS

| | | |
|---|---|---|
| 9,562,282 B2 | 2/2017 | Sasa et al. |
| 2001/0019244 A1 | 9/2001 | Yamazaki et al. |
| 2002/0141417 A1 | 10/2002 | Umayabashi |
| 2006/0285213 A1 | 12/2006 | Kanda et al. |
| 2007/0057625 A1 | 3/2007 | Kim et al. |
| 2008/0050595 A1 | 2/2008 | Nakagawara et al. |
| 2008/0054795 A1 | 3/2008 | Ohmi et al. |
| 2012/0167982 A1 | 7/2012 | Fujishima et al. |
| 2012/0187446 A1 | 7/2012 | Ito et al. |
| 2013/0048348 A1 | 2/2013 | Yamazaki et al. |
| 2013/0087372 A1 | 4/2013 | Nashiki et al. |
| 2013/0280554 A1 | 10/2013 | Yamazaki et al. |
| 2014/0079927 A1 | 3/2014 | Yoshioka et al. |
| 2014/0141237 A1 | 5/2014 | Takeyasu et al. |
| 2014/0353140 A1 | 12/2014 | Haishi et al. |
| 2015/0086789 A1 | 3/2015 | Kajihara et al. |
| 2015/0357077 A1 | 12/2015 | Sasa et al. |
| 2016/0024640 A1 | 1/2016 | Sasa et al. |
| 2016/0024644 A1 | 1/2016 | Sasa et al. |
| 2016/0132183 A1 | 5/2016 | Naoi et al. |
| 2016/0155531 A1 | 6/2016 | Kawakami et al. |
| 2016/0160345 A1 | 6/2016 | Miyamoto et al. |
| 2016/0300632 A1 | 10/2016 | Kawakami et al. |
| 2016/0351752 A1 | 12/2016 | Kuchiyama et al. |
| 2017/0038889 A1 | 2/2017 | Fujino et al. |
| 2017/0047144 A1 | 2/2017 | Kato et al. |
| 2017/0088938 A1 | 3/2017 | Ueda |
| 2017/0271613 A1 | 9/2017 | Ajiki et al. |
| 2017/0358383 A1 | 12/2017 | Fujino et al. |
| 2018/0098422 A1 | 4/2018 | Kuchiyama et al. |
| 2018/0194105 A1 | 7/2018 | Hayakawa et al. |
| 2018/0211823 A1 | 7/2018 | Severin et al. |
| 2019/0122784 A1 | 4/2019 | Fujino et al. |
| 2019/0204728 A1* | 7/2019 | Shishido ............... G03F 1/54 |
| 2019/0233939 A1 | 8/2019 | Miyamoto et al. |
| 2020/0142102 A1 | 5/2020 | Kikuchi |
| 2021/0298129 A1 | 9/2021 | Nakanishi et al. |

FOREIGN PATENT DOCUMENTS

| | | |
|---|---|---|
| CN | 101180687 A | 5/2008 |
| CN | 101211990 A | 7/2008 |
| CN | 102623605 A | 8/2012 |
| CN | 102956287 A | 3/2013 |
| CN | 103345962 A | 10/2013 |
| CN | 103632754 A | 3/2014 |
| CN | 103999166 A | 8/2014 |
| CN | 104213085 A | 12/2014 |
| CN | 104339734 A | 2/2015 |
| CN | 104937678 A | 9/2015 |
| CN | 105637111 A | 6/2016 |
| CN | 107924802 A | 4/2018 |
| CN | 108352217 A | 7/2018 |
| CN | 108352218 A | 7/2018 |
| CN | 108486550 A | 9/2018 |
| CN | 109313962 A | 2/2019 |
| CN | 110033879 A | 7/2019 |
| CN | 110619972 A | 12/2019 |
| CN | 110621494 A | 12/2019 |
| EP | 3438733 A1 | 2/2019 |
| JP | S61-279003 A | 12/1986 |
| JP | S61-290421 A | 12/1986 |
| JP | H01-133961 A | 5/1989 |
| JP | H05-334924 A | 12/1993 |
| JP | H06-041723 A | 2/1994 |
| JP | H07-258827 A | 10/1995 |
| JP | H07-262829 A | 10/1995 |
| JP | H08-77845 A | 3/1996 |
| JP | H08-174746 A | 7/1996 |
| JP | H09-286070 A | 11/1997 |
| JP | H10-36961 A | 2/1998 |
| JP | 2000-038654 A | 2/2000 |
| JP | 2000-48726 A | 2/2000 |
| JP | 2000-282225 A | 10/2000 |
| JP | 2001-060491 A | 3/2001 |
| JP | 2002-271355 A | 9/2002 |
| JP | 2002-371350 A | 12/2002 |
| JP | 2002-371355 A | 12/2002 |
| JP | 2003-293133 A | 10/2003 |
| JP | 2004-43293 A | 2/2004 |
| JP | 2004-355812 A | 12/2004 |
| JP | 2005-268106 A | 9/2005 |
| JP | 2006-99016 A | 4/2006 |
| JP | 2006-286308 A | 10/2006 |
| JP | 2007-80806 A | 3/2007 |
| JP | 2007-141755 A | 6/2007 |
| JP | 2008-88309 A | 4/2008 |
| JP | 2009-290003 A | 12/2009 |
| JP | 2010-080358 A | 4/2010 |
| JP | 2010-248842 A | 11/2010 |
| JP | 2010-275618 A | 12/2010 |
| JP | 2011-018623 A | 1/2011 |
| JP | 2012-188711 A | 10/2012 |
| JP | 2014-103067 A | 6/2014 |
| JP | 2014-157814 A | 8/2014 |
| JP | 2015-022397 A | 2/2015 |
| JP | 2015-63743 A | 4/2015 |
| JP | WO2013/080995 A1 | 4/2015 |
| JP | 2015-221938 A | 12/2015 |
| JP | 2016-008241 A | 1/2016 |
| JP | 2016-136511 A | 7/2016 |
| JP | 5976846 B2 | 8/2016 |
| JP | 2016-179686 A | 10/2016 |
| JP | 2016-191156 A | 11/2016 |
| JP | 2017-42967 A | 3/2017 |
| JP | 2017-71850 A | 4/2017 |
| JP | 2017-091965 A | 5/2017 |
| JP | 2018-41059 A | 3/2018 |
| JP | 2018-063917 A | 4/2018 |
| JP | 2019-003900 A | 1/2019 |
| JP | 2019-030122 A | 2/2019 |
| JP | 2019-030123 A | 2/2019 |
| JP | 2019-046866 A | 3/2019 |
| JP | 2019-059170 A | 4/2019 |
| JP | 2019-077097 A | 5/2019 |
| JP | 2020-021663 A | 2/2020 |
| WO | 02071414 A1 | 9/2002 |
| WO | 2011/034141 A1 | 3/2011 |
| WO | 2012/161095 A1 | 11/2012 |
| WO | 2015/115237 A1 | 8/2015 |
| WO | 2015/151687 A1 | 10/2015 |
| WO | 2016/072441 A1 | 5/2016 |
| WO | 2016/088378 A1 | 6/2016 |
| WO | 2016/152808 A1 | 9/2016 |
| WO | 2016/163323 A1 | 10/2016 |
| WO | 2017/082229 A1 | 5/2017 |
| WO | 2017/170760 A1 | 10/2017 |
| WO | 2019/130841 A1 | 7/2019 |
| WO | 2020/095814 A1 | 5/2020 |

OTHER PUBLICATIONS

Office Action dated Oct. 24, 2023, issued in KR application No. 10-2022-7030806 (counterpart to U.S. Appl. No. 17/912,182), with English translation. (6 pages).

(56) References Cited

OTHER PUBLICATIONS

Office Action dated Mar. 28, 2024, issued in counterpart CN application No. 202180022256.0, with English translation. (18 pages).
Office Action dated Feb. 28, 2024, issued in CN application No. 202180022001.4 (counterpart to U.S. Appl. No. 17/912,187), with English translation. (15 pages).
Non-Final Office Action dated May 8, 2024, issued in U.S. Appl. No. 17/912,196. (82 pages).
Office Action dated Feb. 23, 2024, issued in CN application No. 202180021919.7 (counterpart to U.S. Appl. No. 17/912,196), with English translation. (12 pages).
Office Action dated Mar. 26, 2024, issued in JP application No. 2021-550147 (counterpart to U.S. Appl. No. 17/912,196), with English translation. (8 pages).
Zhao, Jianyong, "Technologies of Flat Panel Display and 3D Display", National Defense Industry Press, Jan. 2012, pp. 34, cited in CN Office Action dated Feb. 23, 2024. (8 pages).
Office Action dated Mar. 27, 2024, issued in CN application No. 202180038168.X (counterpart to U.S. Appl. No. 17/912,196), with English translation. (17 pages).
Office Action dated Jun. 16, 2023, issued in CN application No. 202180022001.4 (counterpart to U.S. Appl. No. 17/912,187), with English translation. (13 pages).
Lui et al., Evidence 1 of Common Knowledge, "Novel Sensor Technique and Its Application" Novel Sensor Technique and Its Application, Beihang University Press, Jun. 1995, p. 23 with its English translation. (17 pages) cited in CN Office Action dated Dec. 28, 2024.
Fan et al., Evidence 2 of Common Knowledge, "Optical Films and Its Application" Optical Films and Its Application, Shanghai Jiao Tong University Press, Feb. 2014, pp. 96-100, with its English translation. (10 pages) cited in CN Office Action dated Dec. 28, 2024.
Yukui Gao, Evidence 3 of Common Knowledge, "Theory and Application of Residual Stresses" Shanghai Scientific & Technical Publishers, Jul. 2019, p. 11, with its English translation. (17 pages) cited in CN Office Action dated Dec. 28, 2024.
Office Action dated Dec. 28, 2023 issued in counterpart CN application No. 202180022368.6, with English translation. (18 pages).
Office Action dated Jan. 12, 2024 issued in CN application No. 202180022926.6, (counterpart to U.S. Appl. No. 17/912,196), with English translation. (14 pages).
Trial and Appeal Decision dated Jan. 24, 2023, issued in counterpart JP application No. 2021-517074, with English translation. (18 pages).
Office Action dated Sep. 10, 2023, issued in counterpart CN application No. 202180022256.0, with English translation. (21 pages).
Office Action dated Oct. 9, 2023, issued in counterpart CN application No. 202180022368.6, with English translation. (16 pages).
Final Office Action dated Nov. 29, 2023, issued in U.S. Appl. No. 17/912,182. (40 pages).
Office Action dated Sep. 29, 2023, issued in CN application No. 202180021961.9 (counterpart to U.S. Appl. No. 17/912,187), with English translation. (12 pages).
Office Action dated Sep. 30, 2023, issued in CN application No. 202180022926.9 (counterpart to U.S. Appl. No. 17/912,196), with English translation. (13 pages).
Office Action dated Sep. 6, 2022, issued in JP application No. 2021-517074, with English translation. (8 pages).
Reconsideration Report before Appeal dated Mar. 4, 2022, issued in JP application No. 2021-517070, with English translation. (3 pages).
Decision of Refusal dated Feb. 15, 2022, issued in JP application No. 2021-517066, with English translation. (4 pages).
Notification of Reasons for Refusal dated Jan. 25, 2022, issued in JP application No. 2021-574330, with English translation. (3 pages).
Notice of Reasons for Refusal dated Feb. 1, 2022, issued in JP application No. 2021-545721, with English translation. (7 pages).
Notification of Reasons for Refusal dated Jan. 25, 2022, issued in JP application No. 2021-574330, with English translation. (5 pages).
Decision of Refusal dated Mar. 15, 2022, issued in JP application No. 2021-545721, with English translation. (13 pages).
Notification of Reasons for Refusal dated Jan. 5, 2022, issued in JP application No. 2021-517066, with English translation. (6 pages).
Notification of Reasons for Refusal dated Oct. 12, 2021, issued in JP application No. 2021-545482, with English translation. (7 pages).
Office Action dated Feb. 15, 2022, issued in JP application No. 2021-517066, with English translation. (5 pages).
Notification of Reasons for Refusal dated Aug. 24, 2021, issued in JP application No. 2021-517070, with English translation. (8 pages).
Kulkarni et al., "Electrical, optical and structural characteristics of indium-tin-oxide thin films deposited on glass and polymer substrates", Thin Solid Films, Elsevier, 1997, vol. 308-309, pp. 1-7. (8 pages).
Notice of Reasons for Refusal dated Oct. 12, 2021, issued in JP application No. 2021-517070, with English translation. (8 pages).
Decision of Refusal dated Nov. 24, 2021, issued in JP application No. 2021-517070, with English translation. (9 pages).
Notification of Reasons for Refusal dated Jan. 5, 2022, issued in JP application No. 2021-545485, with English translation. (6 pages).
Decision of Refusal dated Feb. 15, 2022, issued in JP application No. 2021-545485, with English translation. (6 pages).
Notification of Reasons for Refusal dated Jan. 18, 2022, issued in JP application No. 2021-545486, with English translation. (4 pages).
Decision of Refusal dated Mar. 1, 2022, issued in JP application No. 2021-545486, with English translation. (6 pages).
Notification of Reasons for Refusal dated Jan. 18, 2022, issued in JP application No. 2021-545484, with English translation. (5 pages).
Decision of Refusal dated Mar. 1, 2022, issued in JP application No. 2021-545484, with English translation. (4 pages).
Notification of Reasons for Refusal dated Oct. 12, 2021, issued in JP application No. 2021-545487, with English translation. (6 pages).
Decision of Refusal dated Nov. 16, 2021, issued in JP application No. 2021-545487, with English translation. (5 pages).
Notification of Reasons for Refusal dated Oct. 12, 2021, issued in JP application No. 2021-545488, with English translation. (6 pages).
Decision of Refusal dated Nov. 16, 2021, issued in JP application No. 2021-545488, with English translation. (8 pages).
Notification of Reasons for Refusal dated Aug. 24, 2021, issued in JP application No. 2021-517073, with English translation. (6 pages).
Decision of Refusal dated Nov. 24, 2021, issued in JP application No. 2021-517073, with English translation. (6 pages).
Notification of Reasons for Refusal dated Oct. 5, 2021, issued in JP application No. 2021-517074, with English translation. (6 pages).
Decision of Refusal dated Nov. 24, 2021, issued in JP application No. 2021-517074, with English translation. (6 pages).
Reconsideration Report before Appeal dated Jun. 6, 2022, issued in JP application No. 2021-545485, with English translation. (4 pages).
Reconsideration Report before Appeal dated Jun. 6, 2022, issued in JP application No. 2021-517066, with English translation. (5 pages).
Reconsideration Report before Appeal dated Jun. 30, 2022, issued in JP application No. 2021-545486, with English translation. (4 pages).
Reconsideration Report before Appeal dated Jun. 29, 2022, issued in JP application No. 2021-545721, with English translation. (4 pages).
Office Action dated Sep. 20, 2022, issued in JP application No. 2021-193794, with English translation. (7 pages).
U.S. Appl. No. 17/912,182, filed Sep. 16, 2022.
U.S. Appl. No. 17/912,187, filed Sep. 16, 2022.
U.S. Appl. No. 17/912,196, filed Sep. 16, 2022.
Office Action dated May 9, 2023, issued in counterpart JP application No. 2022-025297, with English translation. (8 pages).
Office Action dated Jun. 5, 2023, issued in counterpart KR application No. 10-2022-7030806, with English translation. (6 pages).
Office Action dated Apr. 6, 2023, issued in counterpart CN application No. 202180022256.0, with English translation. (14 pages).
Office Action dated Apr. 26, 20223, issued in CN Application No. 202180022925.4, with English Translation. (counterpart to U.S. Appl. No. 17/912,196)(15 pages).

(56) References Cited

OTHER PUBLICATIONS

Office Action dated May 17, 2023, issued in CN application no. 202180021801.4, with English translation (counterpart to U.S. Appl. No. 17/912,187). (14 pages).
Office Action dated May 9, 2023, issued in CN application No. 202180022926.9, with English translation (counterpart to U.S. Appl. No. 17/912,196). (17 pages).
Non-Final Office Action dated Aug. 3, 2023, issued in U.S. Appl. No. 17/912,182. (42 pages).
Singh et al., "Residual and Induced Birefringence Measurement of ITO-Coated PET Substrate by Photoelastic Method", Journal of Display Technology, Dec. 2015, vol. 11, No. 12, pp. 1035-1041, cited in Non-Final Office dated Aug. 3, 2023. (7 page).
Office Action dated Jul. 13, 2023, issued in CN application No. 202180021919.7 (counterpart to U.S. Appl. No. 17/912,196), with English translation. (14 pages).
Office Action dated Jul. 28, 2023, issued in counterpart CN application No. 202180029837.7, with English translation. (14 pages).
Notification Concerning Transmittal of Translation of the International Preliminary Report on Patentability (Form PCT/IB/326) issued in International application No. PCT/JP2021/011152 mailed Sep. 29, 2022 with Forms PCT/IB/373, PCT/IB/338 and PCT/ISA/237, with English translation (counterpart to U.S. Appl. No. 17/912,187). (10 pages).
Notification Concerning Transmittal of Translation of the International Preliminary Report on Patentability (Form PCT/IB/326) issued in counterpart International application No. PCT/JP2021/011153 mailed Sep. 29, 2022 with Forms PCT/IB/373, PCT/IB/338 and PCT/ISA/237, with English translation. (12 pages).
Notification Concerning Transmittal of Translation of the International Preliminary Report on Patentability (Form PCT/IB/326) issued in International application No. PCT/JP2021/011163 mailed Sep. 29, 2022 with Forms PCT/IB/373, PCT/IB/338 and PCT/ISA/237, with English translation (counterpart to U.S. Appl. No. 17/912,182). (12 pages).
Notification Concerning Transmittal of Translation of the International Preliminary Report on Patentability (Form PCT/IB/326) issued in International application No. PCT/JP2021/011166 mailed Sep. 29, 2022 with Forms PCT/IB/373, PCT/IB/338 and PCT/ISA/237, with English translation (counterpart to U.S. Appl. No. 17/912,196). (12 pages).
Notification Concerning Transmittal of Translation of the International Preliminary Report on Patentability (Form PCT/IB/326) issued in International application No. PCT/JP2021/011146 mailed Sep. 29, 2022 with Forms PCT/IB/373, PCT/IB/338 and PCT/ISA/237, with English translation. (10 pages).
Notification Concerning Transmittal of Translation of the International Preliminary Report on Patentability (Form PCT/IB/326) issued in International application No. PCT/JP2021/011147 mailed Dec. 8, 2022 with Forms PCT/IB/373, PCT/IB/338 and PCT/ISA/237, with English translation. (12 pages).
Notification Concerning Transmittal of Translation of the International Preliminary Report on Patentability (Form PCT/IB/326) issued in International application No. PCT/JP2021/011148 mailed Sep. 29, 2022 with Forms PCT/IB/373, PCT/IB/338 and PCT/ISA/237, with English translation. (12 pages).
Notification Concerning Transmittal of Translation of the International Preliminary Report on Patentability (Form PCT/IB/326) issued in International application No. PCT/JP2021/011149 mailed Sep. 29, 2022 with Forms PCT/IB/373, PCT/IB/338 and PCT/ISA/237, with English translation. (10 pages).
Notification Concerning Transmittal of Translation of the International Preliminary Report on Patentability (Form PCT/IB/326) issued in International application No. PCT/JP2021/011150 mailed Sep. 29, 2022 with Forms PCT/IB/373, PCT/IB/338 and PCT/ISA/237, with English translation. (10 pages).
Notification Concerning Transmittal of Translation of the International Preliminary Report on Patentability (Form PCT/IB/326) issued in International application No. PCT/JP2021/011151 mailed Sep. 29, 2022 with Forms PCT/IB/373, PCT/IB/338 and PCT/ISA/237, with English translation. (10 pages).
Notification Concerning Transmittal of Translation of the International Preliminary Report on Patentability (Form PCT/IB/326) issued in International application No. PCT/JP2021/011154 mailed Sep. 29, 2022 with Forms PCT/IB/373, PCT/IB/338 and PCT/ISA/237, with English translation. (12 pages).
Notification Concerning Transmittal of Translation of the International Preliminary Report on Patentability (Form PCT/IB/326) issued in International application No. PCT/JP2021/011155 mailed Sep. 29, 2022 with Forms PCT/IB/373, PCT/IB/338 and PCT/ISA/237, with English translation. (10 pages).
Notification Concerning Transmittal of Translation of the International Preliminary Report on Patentability (Form PCT/IB/326) issued in International application No. PCT/JP2021/011156 mailed Sep. 29, 2022 with Forms PCT/IB/373, PCT/IB/338 and PCT/ISA/237, with English translation. (12 pages).
Notification Concerning Transmittal of Translation of the International Preliminary Report on Patentability (Form PCT/IB/326) issued in International application No. PCT/JP2021/011157 mailed Nov. 3, 2022 with Forms PCT/IB/373, PCT/IB/338 and PCT/ISA/237, with English translation. (10 pages).
Notification Concerning Transmittal of Translation of the International Preliminary Report on Patentability (Form PCT/IB/326) issued in International application No. PCT/JP2021/011158 mailed Nov. 3, 2022 with Forms PCT/IB/373, PCT/IB/338 and PCT/ISA/237, with English translation. (10 pages).
Notification Concerning Transmittal of Translation of the International Preliminary Report on Patentability (Form PCT/IB/326) issued in International application No. PCT/JP2021/011159 mailed Sep. 29, 2022 with Forms PCT/IB/373, PCT/IB/338 and PCT/ISA/237, with English translation. (13 pages).
Notification Concerning Transmittal of Translation of the International Preliminary Report on Patentability (Form PCT/IB/326) issued in International application No. PCT/JP2021/011160 mailed Sep. 29, 2022 with Forms PCT/IB/373, PCT/IB/338 and PCT/ISA/237, with English translation. (13 pages).
Notification Concerning Transmittal of Translation of the International Preliminary Report on Patentability (Form PCT/IB/326) issued in International application No. PCT/JP2021/011161 mailed Sep. 29, 2022 with Forms PCT/IB/373, PCT/IB/338 and PCT/ISA/237, with English translation. (12 pages).
Notification Concerning Transmittal of Translation of the International Preliminary Report on Patentability (Form PCT/IB/326) issued in International application No. PCT/JP2021/011162 mailed Sep. 29, 2022 with Forms PCT/IB/373, PCT/IB/338 and PCT/ISA/237, with English translation. (12 pages).
Notification Concerning Transmittal of Translation of the International Preliminary Report on Patentability (Form PCT/IB/326) issued in International application No. PCT/JP2021/011164 mailed Sep. 29, 2022 with Forms PCT/IB/373, PCT/IB/338 and PCT/ISA/237, with English translation. (12 pages).
Notification Concerning Transmittal of Translation of the International Preliminary Report on Patentability (Form PCT/IB/326) issued in International application No. PCT/JP2021/011165 mailed Sep. 29, 2022 with Forms PCT/IB/373, PCT/IB/338 and PCT/ISA/237, with English translation. (12 pages).
Office Action dated Nov. 15, 2022, issued in JP application No. 2021-180164, with English translation. (9 pages).
Office Action dated Apr. 22, 2023, issued in counterpart CN application No. 202180022368.6, with English translation. (22 pages).
Office Action dated Dec. 1, 2023, issued in counterpart CN application No. 202180022256.0, with English translation. (11 pages).
Office Action dated Dec. 21, 2023, issued in counterpart CN application No. 202180029837.7, with English translation. (11 pages).
Office Action dated Nov. 22, 2023, issued in CN application No. 202180021919.7 (counterpart to U.S. Appl. No. 17/912,196), with English translation. (10 pages).
Office Action dated Jul. 23, 2024, issued in JP application No. 2022-074251 (counterpart to U.S. Appl. No. 17/912,187), with English translation. (4 pages).

(56) References Cited

OTHER PUBLICATIONS

Office Action dated Jun. 4, 2024, issued in JP application No. 2021-550146 (counterpart to U.S. Appl. No. 17/912,196), with English translation. (13 pages).
Final Office Action dated Aug. 15, 2024, issued in U.S. Appl. No. 17/912,196. (19 pages).
Office Action dated Sep. 24, 2024, issued in counterpart KR application No. 10-2022-7030802, with English translation. (8 pages).
Office Action dated Aug. 27, 2024, issued in JP application No. 2021-550147 (counterpart to U.S. Appl. No. 17/912,196), with English translation. (10 pages).
Office Action dated May 10, 2024, issued in counterpart TW application No. 110110038, with English translation. (12 pages).
Office Action dated Apr. 23, 2024, issued in counterpart KR application No. 10-2022-7030806, with English translation. (25 pages).
Office Action dated May 28, 2024, issued in counterpart JP application No. 2021-545722, with English translation. (12 pages).
Office Action dated May 15, 2024, issued in TW application No. 110110069 (counterpart to U.S. Appl. No. 17/912,187), with English translation. (9 pages).
Non-Final Office Action dated Jun. 13, 2024, issued in U.S. Appl. No. 17/912,187. (77 pages).
DeWald, A et al., "Compressive Residual Stress", Hill Engineering, 2017, pp. 1-7, retrieved from <https://hill-engineering.com/general-interest/compressive-residual-stress/>. (7 pages).
Office Action dated Apr. 10, 2024, issued in CN application No. 202180022465.5 (counterpart to U.S. Appl. No. 17/912,196), with English translation. (19 pages).

* cited by examiner

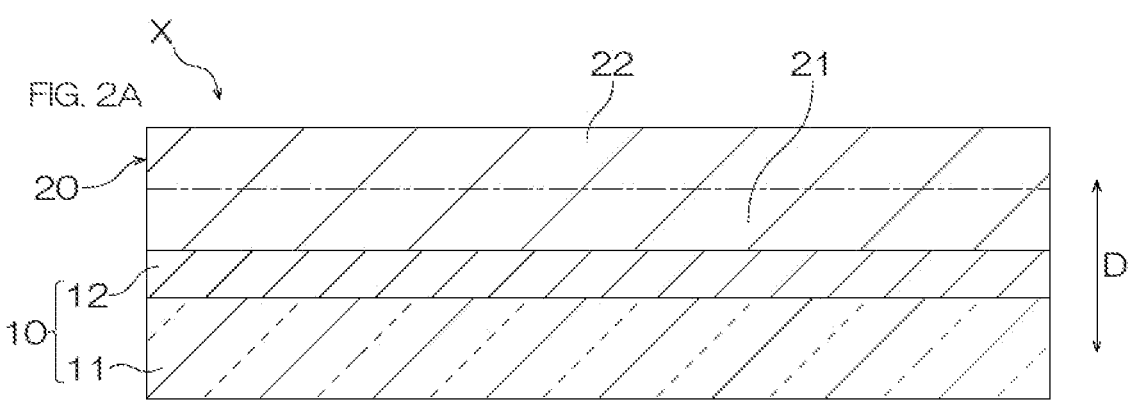
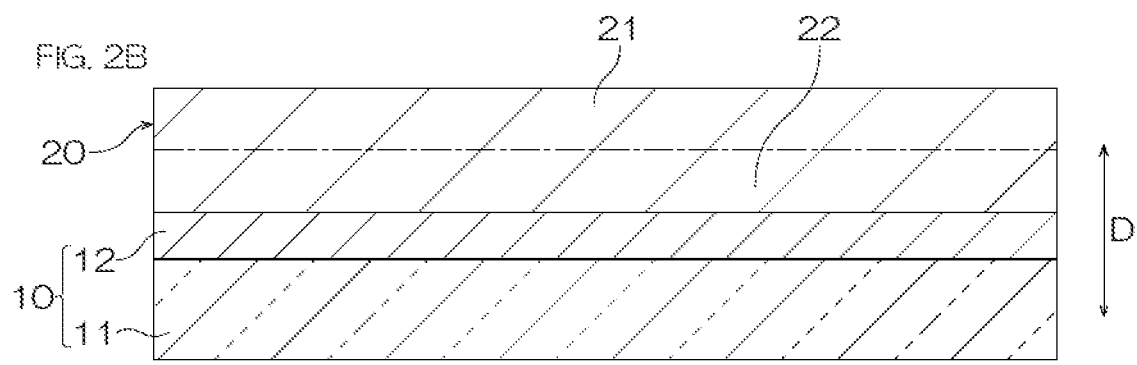

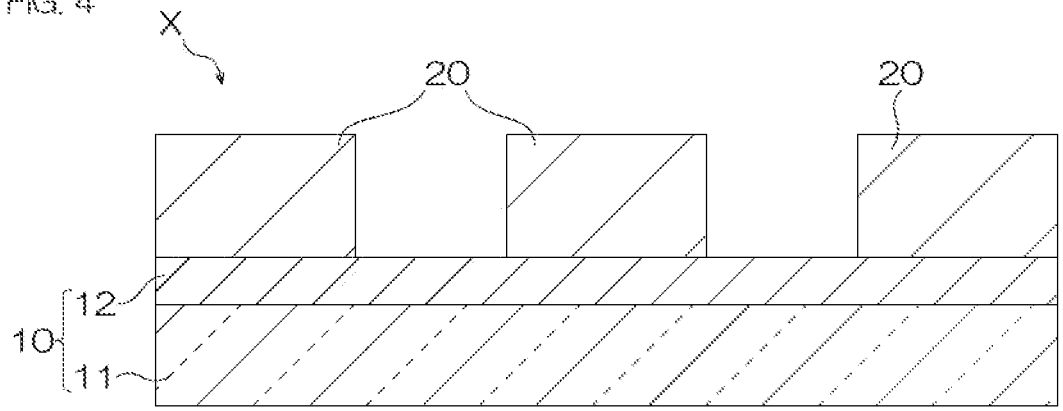

LIGHT-TRANSMITTING ELECTROCONDUCTIVE FILM AND TRANSPARENT ELECTROCONDUCTIVE FILM

TECHNICAL FIELD

The present invention relates to a light-transmitting electroconductive film and a transparent electroconductive film.

BACKGROUND ART

Transparent electrodes in various devices such as a liquid crystal display, a touch panel, and an optical sensor are formed of a film (light-transmitting electroconductive film) having both optical transparency and electroconductivity. The light-transmitting electroconductive film may also be used as an antistatic layer included in a device. The light-transmitting electroconductive film is formed by, for example, depositing an electroconductive oxide on a transparent substrate by a sputtering method. In the sputtering method, an inert gas such as argon is used as a sputtering gas for colliding with a target (a film formation material supply) to sputter atoms on a target surface. The technique relating to the light-transmitting electroconductive film is disclosed in, for example, Patent Document 1 below.

CITATION LIST

Patent Document

Patent Document 1: Japanese Unexamined Patent Publication No. 5-334924

SUMMARY OF THE INVENTION

Problem to be Solved by the Invention

Light-transmitting electroconductive films are required to have low resistance. In particular, light-transmitting electroconductive films for transparent electrode applications are strongly required to have such. In addition, light-transmitting electroconductive films for display, window or vehicle-mounted applications are required to suppress a yellowish tint in view of ensuring good appearance.

The present invention provides a light-transmitting electroconductive film suitable for reducing resistance and suppressing a yellowish tint, and a transparent electroconductive film including the light-transmitting electroconductive film.

Means for Solving the Problem

The present invention [1] includes a light-transmitting electroconductive film having a thickness and including a region containing krypton at a content ratio of less than 0.1 atomic % at least partially in the thickness direction.

The present invention [2] includes the light-transmitting electroconductive film described in [1] containing krypton at a content ratio of less than 0.1 atomic % over an entire region in the thickness direction.

The present invention [3] includes the light-transmitting electroconductive film described in [1] including a region containing no krypton at least partially in the thickness direction.

The present invention [4] includes the light-transmitting electroconductive film described in [3], wherein the region containing no krypton contains argon.

The present invention [5] includes the light-transmitting electroconductive film described in any one of the above-described [1] to [4], wherein the light-transmitting electroconductive film is patterned.

The present invention [6] includes a transparent electroconductive film including a transparent substrate; and a light-transmitting electroconductive film described in any one of the above-described [1] to [5], disposed on one surface side in a thickness direction of the transparent substrate.

Effects of the Invention

The light-transmitting electroconductive film of the present invention, which includes a region containing krypton at a content ratio of less than 0.1 atomic % at least partially in the thickness direction, is suitable for reducing resistance and suppressing a yellowish tint. The transparent electroconductive film of the present invention, which includes such a light-transmitting electroconductive film, is suitable for reducing resistance and suppressing a yellowish tint.

BRIEF DESCRIPTION OF THE DRAWINGS

FIGS. 2A and 2B each schematically represents an example where a light-transmitting electroconductive film of the transparent electroconductive film shown in FIG. 1 contains Kr in a partial region in its thickness direction: FIG. 2A represents a case where the light-transmitting electroconductive film includes a first region (Kr-containing region) and a second region (Kr-free region) in this order from a transparent substrate side, and FIG. 2B represents a case where the light-transmitting electroconductive film includes the second region (Kr-free region) and the first region (Kr-containing region) in this order from the transparent substrate side.

FIG. 3A represents a step of preparing a resin film, FIG. 3B represents a step of forming a functional layer on the resin film, FIG. 3C represents a step of forming a light-transmitting electroconductive film on the functional layer, and FIG. 3D represents a step of crystallizing the light-transmitting electroconductive film.

FIG. 4 represents a case where the light-transmitting electroconductive film of the transparent electroconductive film shown in FIG. 1 is patterned.

DESCRIPTION OF THE EMBODIMENTS

Figure 1:
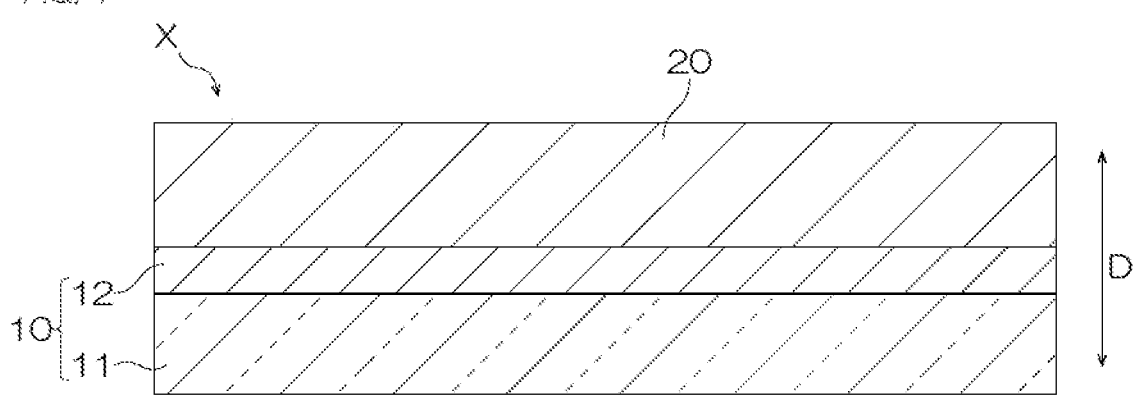
FIG. 1 is a schematic cross-sectional view of an embodiment of a transparent electroconductive film according to the present invention.

As shown in FIG. 1, a transparent electroconductive film X includes a transparent substrate 10 and a light-transmitting electroconductive film 20 in this order toward one side of a thickness direction D. The transparent electroconductive film X, the transparent substrate 10, and the light-transmitting electroconductive film 20 each have a shape extending in a direction (plane direction) orthogonal to the thickness direction D. The transparent electroconductive film X and the light-transmitting electroconductive film 20 included therein are one element provided in a touch sensor, a light control element, a photoelectric conversion element, a hot wire control member, an antenna member, an electromagnetic wave shielding member, a heater member, an illuminating device, an image display device, and the like.

The transparent substrate 10 includes a resin film 11 and a functional layer 12 in this order toward one side of the thickness direction D.

The resin film 11 is a transparent resin film having flexibility. Examples of the material of the resin film 11 include polyester resin, polyolefin resin, acrylic resin, polycarbonate resin, polyether sulfone resin, polyarylate resin, melamine resin, polyamide resin, polyimide resin, cellulose resin, and polystyrene resin. Examples of the polyester resin include polyethylene terephthalate (PET), polybutylene terephthalate, and polyethylene naphthalate. Examples of the polyolefin resin include polyethylene, polypropylene, and cycloolefin polymer. Examples of the acrylic resin include polymethacrylate. As the material of the resin film 11, preferably, a polyester resin is used, more preferably, a PET is used, for example, in view of transparency and strength.

A functional layer 12-side surface of the resin film 11 may be surface-modified in a surface modification treatment. Examples of the surface modification treatment include corona treatment, plasma treatment, ozone treatment, primer treatment, glow treatment, and coupling agent treatment.

The resin film 11 has a thickness of preferably 1 μm or more, more preferably 10 μm or more, even more preferably 30 μm or more. The resin film 11 has a thickness of preferably 300 μm or less, more preferably 200 μm or less, even more preferably 100 μm or less, particularly preferably 75 μm or less. These configurations relating to the thickness of the resin film 11 are suitable for ensuring the handleability of the transparent electroconductive film X.

The resin film 11 has a total light transmittance (JIS K 7375-2008) of preferably 60% or more, more preferably 80% or more, even more preferably 85% or more. This configuration is suitable for ensuring the transparency required for the transparent electroconductive film X when the transparent electroconductive film X is provided in a touch sensor, a light control element, a photoelectric conversion element, a hot wire control member, an antenna member, an electromagnetic wave shielding member, a heater member, an illuminating device, an image display device, and the like. The resin film 11 has a total light transmittance of, for example, 100% or less.

In the present embodiment, the functional layer 12 is disposed on one surface in the thickness direction D of the resin film 11. In the present embodiment, the functional layer 12 is a hard coat layer for preventing a scratch from being formed on an exposed surface (upper surface in FIG. 1) of the light-transmitting electroconductive film 20.

The hard coat layer is a cured product of a curable resin composition. Examples of the resin contained in the curable resin composition include polyester resin, acrylic resin, urethane resin, amide resin, silicone resin, epoxy resin, and melamine resin. Examples of the curable resin composition include an ultraviolet curing type resin composition and a thermosetting type resin composition. As the curable resin composition, an ultraviolet curing type resin composition is preferably used in view of serving to improve production efficiency of the transparent electroconductive film X because it can be cured without heating at a high temperature. As the ultraviolet curing type resin composition, specifically, a composition for forming a hard coat layer described in Japanese Unexamined Patent Publication No. 2016-179686 is used.

A light-transmitting electroconductive film 20-side surface of the functional layer 12 may be surface-modified in a surface modification treatment. Examples of the surface modification treatment include corona treatment, plasma treatment, ozone treatment, primer treatment, glow treatment, and coupling agent treatment.

The functional layer 12 serving as the hard coat layer has a thickness of preferably 0.1 μm or more, more preferably 0.5 μm or more. This configuration is suitable for allowing the light-transmitting electroconductive film 20 to have sufficient scratch resistance. The functional layer 12 serving as the hard coat layer has a thickness of preferably 10 μm or less, more preferably 5 μm or less in view of ensuring the transparency of the functional layer 12.

The transparent substrate 10 has a thickness of preferably 1 μm or more, more preferably 10 μm or more, even more preferably 15 μm or more, particularly preferably 30 μm or more. The transparent substrate 10 has a thickness of preferably 310 μm or less, more preferably 210 μm or less, even more preferably 110 μm or less, particularly preferably 80 μm or less. These configurations relating to the thickness of the transparent substrate 10 are suitable for ensuring the handleability of the transparent electroconductive film X.

The transparent substrate 10 has a total light transmittance (JIS K 7375-2008) of preferably 60% or more, more preferably 80% or more, even more preferably 85% or more. This configuration is suitable for ensuring the transparency required for the transparent electroconductive film X when the transparent electroconductive film X is provided in a touch sensor, a light control element, a photoelectric conversion element, a hot wire control member, an antenna member, an electromagnetic wave shielding member, a heater member, an illuminating device, an image display device, and the like. The transparent substrate 10 has a total light transmittance of, for example, 100% or less.

In the present embodiment, the light-transmitting electroconductive film 20 is disposed on one surface in the thickness direction D of the transparent substrate 10. The light-transmitting electroconductive film 20 is an embodiment of the light-transmitting electroconductive film according to the present invention and has both optical transparency and electroconductivity. The light-transmitting electroconductive film 20 is a layer formed of a light-transmitting electroconductive material. The light-transmitting electroconductive material contains, for example, an electroconductive oxide as a main component.

Examples of the electroconductive oxide include metal oxides containing at least one kind of metal or metalloid selected from the group consisting of In, Sn, Zn, Ga, Sb, Ti, Si, Zr, Mg, Al, Au, Ag, Cu, Pd, and W. Specific examples of the electroconductive oxide include an indium-containing electroconductive oxide and an antimony-containing electroconductive oxide. Examples of the indium-containing electroconductive oxide include an indium tin composite oxide (ITO), an indium zinc composite oxide (IZO), an indium gallium composite oxide (IGO), and an indium gallium zinc composite oxide (IGZO). Examples of the antimony-containing electroconductive oxide include an antimony tin composite oxide (ATO). In view of realizing high transparency and good electrical conductivity, as the electroconductive oxide, preferably an indium-containing electroconductive oxide is used, more preferably, an ITO is used. Such ITO may contain a metal or a metalloid other than In and Sn in an amount less than the content of each of In and Sn.

When an ITO is used as the electroconductive oxide, the ratio of the content of tin oxide ($SnO_2$) to the total content of indium oxide ($In_2O_3$) and tin oxide in the ITO is preferably 0.1% by mass or more, more preferably 1% by mass or more, even more preferably 3% by mass or more, further preferably 5% by mass or more, particularly preferably 7% by mass or more. The proportion of the number of tin atoms to the number of indium atoms (number of tin atoms/number of indium atoms) in the ITO is preferably 0.001 or more, more preferably 0.01 or more, even more preferably 0.03 or more, further preferably 0.05 or more, particularly preferably 0.07 or more. These configurations are suitable for ensuring durability of the light-transmitting electroconductive film 20.

The ratio of the content of tin oxide ($SnO_2$) to the total content of indium oxide ($In_2O_3$) and tin oxide in the ITO is preferably 15% by mass or less, more preferably 13% by mass or less, even more preferably 12% by mass or less. The proportion of the number of tin atoms to the number of indium atoms (number of tin atoms/number of indium atoms) in the ITO is preferably 0.16 or less, more preferably 0.14 or less, even more preferably 0.13 or less. These configurations are suitable for ensuring ease of crystallization of an amorphous light-transmitting electroconductive film 20 by heating, where the film 20 is formed in a film deposition step in a transparent electroconductive film production method to be described later.

The proportion of the number of tin atoms to the number of indium atoms in the ITO is determined by, for example, specifying proportions of the indium atom and the tin atom present in an object to be measured by X-ray photoelectron spectroscopy. The above-mentioned content ratio of the tin oxide in the ITO is determined from, for example, such specified proportions of the indium atom and the tin atom present therein. The above-mentioned content ratio of tin oxide in the ITO may also be judged from the content ratio of tin oxide ($SnO_2$) in an ITO target used during sputtering film formation.

The light-transmitting electroconductive film 20 contains krypton (Kr) as a rare gas atom. In the present embodiment, the rare gas atom in the light-transmitting electroconductive film 20 is derived from a rare gas atom used as a sputtering gas in a sputtering method to be described later for forming the light-transmitting electroconductive film 20. In the present embodiment, the light-transmitting electroconductive film 20 is a film (sputtered film) deposited by the sputtering method.

The light-transmitting electroconductive film 20 includes a Kr-containing region in which a content ratio of Kr is less than 0.1 atomic %, preferably 0.09 atomic % or less, more preferably 0.08 atomic % or less, even more preferably 0.07 atomic % or less, further preferably 0.06 atomic % or less, particularly preferably 0.05 atomic % or less, partially in the thickness direction D. The Kr content ratio in the region is, for example, 0.0001 atomic % or more. Preferably, the light-transmitting electroconductive film 20 satisfies such Kr content ratio entirely in the thickness direction D (in this case, the entire region in the thickness direction D of the light-transmitting electroconductive film 20 is the Kr-containing region). Specifically, the content ratio of Kr in the light-transmitting electroconductive film 20 is less than 0.1 atomic %, preferably 0.09 atomic % or less, more preferably 0.08 atomic % or less, even more preferably 0.07 atomic % or less, further preferably 0.06 atomic % or less, particularly preferably 0.05 atomic % or less, entirely in the thickness direction D. These configurations are suitable for forming large crystal grains by achieving good crystal growth when an amorphous light-transmitting electroconductive film 20 is crystallized by heating in the course of producing the transparent electroconductive film X, and thus, suitable for obtaining the light-transmitting electroconductive film 20 having low resistance (the larger the crystal grains in the light-transmitting electroconductive film 20, the lower the resistance of the light-transmitting electroconductive film 20). The above configurations relating to the Kr content in the light-transmitting electroconductive film 20 are also suitable for suppressing a yellowish tint of the light-transmitting electroconductive film 20. That is, the above configurations relating to the Kr content are suitable for achieving both reduction of resistance and suppression of the yellowish tint of the light-transmitting electroconductive film 20.

The Kr content ratio in the light-transmitting electroconductive film 20 can be controlled by adjusting various conditions at the time when the light-transmitting electroconductive film 20 is deposited by sputtering. Examples of the conditions include a Kr content ratio in a sputtering gas introduced into a film deposition chamber during sputtering film formation, and an amount (flow rate) of the sputtering gas introduced.

The presence or absence of and the content of the rare gas atom such as Kr in the light-transmitting electroconductive film 20 are identified by, for example, Rutherford backscattering spectrometry to be described later regarding Examples. The presence or absence of the rare gas atom such as Kr in the light-transmitting electroconductive film 20 is identified by, for example, X-ray fluorescence analysis to be described later regarding Examples. In the following case, a light-transmitting electroconductive film is judged to include a region in which the content ratio of the rare gas atom such as Kr is 0.0001 atomic % or more: the rare gas atom content in a light-transmitting electroconductive film to be analyzed is less than a detection limit value (lower limit value) and cannot be quantified in Rutherford backscattering spectrometry, and the presence of the rare gas atom in the light-transmitting electroconductive film is identified by X-ray fluorescence analysis.

The content ratio of Kr in the Kr-containing region of the light-transmitting electroconductive film 20 may be non-uniform in the thickness direction D. For example, in the Kr-containing region, the Kr content ratio may gradually increase or decrease in the thickness direction D depending on the distance from the transparent substrate 10. Alternatively, the light-transmitting electroconductive film 20 may have a partial region on the transparent substrate 10 side in which the Kr content ratio gradually increases in the thickness direction D depending on the distance from the transparent substrate 10, and a partial region on the opposite side to the transparent substrate 10 in which the Kr content ratio gradually decreases in the thickness direction D depending on the distance from the transparent substrate 10. Alternatively, the light-transmitting electroconductive film 20 may have a partial region on the transparent substrate 10 side in which the Kr content ratio gradually decreases in the thickness direction D depending on the distance from the transparent substrate 10, and a partial region on the opposite side to the transparent substrate 10 in which the Kr content ratio gradually increases in the thickness direction D depending on the distance from the transparent substrate 10.

When the light-transmitting electroconductive film 20 contains a rare gas atom other than Kr, examples of the rare gas atom other than Kr include argon (Ar) and xenon (Xe). In view of reducing production cost of the transparent electroconductive film X, the light-transmitting electroconductive film 20 preferably contains no Xe.

The content ratio of the rare gas atom (including Kr) in the light-transmitting electroconductive film 20 is preferably 1.2 atomic % or less, more preferably 1.1 atomic % or less, even more preferably 1.0 atomic % or less, even more preferably 0.8 atomic % or less, even more preferably 0.5 atomic % or less, even more preferably 0.4 atomic % or less, even more preferably 0.3 atomic % or less, even more preferably 0.2 atomic % or less, entirely in the thickness direction D. This configuration is suitable for forming large crystal grains by achieving good crystal growth when an amorphous light-transmitting electroconductive film 20 is crystallized by heating in the course of producing the transparent electroconductive film X, and thus, suitable for obtaining the light-transmitting electroconductive film 20 having low resistance. The content ratio of the rare gas atom in the light-transmitting electroconductive film 20 is preferably, for example, 0.0001 atomic % or more entirely in the thickness direction D.

FIG. 2 schematically represents an example where the light-transmitting electroconductive film 20 contains Kr in a partial region in the thickness direction D. FIG. 2A represents a case where the light-transmitting electroconductive film 20 includes a first region 21 and a second region 22 in this order from the transparent substrate 10 side. The first region 21 contains Kr. The second region 22 contains no Kr but contains, for example, a rare gas atom other than Kr. FIG. 2B represents a case where the light-transmitting electroconductive film 20 includes the second region 22 and the first region 21 in this order from the transparent substrate 10 side. In FIGS. 2A and 2B, a boundary between the first region 21 and the second region 22 is drawn in phantom line. However, where the first region 21 and the second region 22 are not significantly different in terms of the composition other than a very small amount of rare gas atom contained, or the like, the boundary between the first region 21 and the second region 22 may not be able to be discriminated.

When the light-transmitting electroconductive film 20 includes the first region 21 (Kr-containing region) and the second region 22 (Kr-free region), the light-transmitting electroconductive film 20 preferably includes the first region 21 and the second region 22 in this order from the transparent substrate 10 side in view of suppressing the yellowish tint of the light-transmitting electroconductive film 20 and in view of suppressing the yellowish tint of the transparent electroconductive film X.

When the light-transmitting electroconductive film 20 includes the first region 21 and the second region 22, the ratio of the thickness of the first region 21 with respect to the total thickness of the first region 21 and the second region 22 is, for example, 1% or more, preferably 20% or more, more preferably 30% or more, even more preferably 40% or more, particularly preferably 50% or more. The ratio thereof is less than 100%. The ratio of the thickness of the second region 22 with respect to the total thickness of the first region 21 and the second region 22 is, for example, 99% or less, preferably 80% or less, more preferably 70% or less, even more preferably 60% or less, particularly preferably 50% or less. These configurations are preferred in view of suppressing the yellowish tint of the light-transmitting electroconductive film 20 and in view of suppressing the yellowish tint of the transparent electroconductive film X.

The light-transmitting electroconductive film 20 has a thickness of preferably 10 nm or more, more preferably 30 nm or more, even more preferably 50 nm or more, further preferably 80 nm or more, particularly preferably 100 nm or more. This configuration is suitable for reducing resistance of the light-transmitting electroconductive film 20. The light-transmitting electroconductive film 20 has a thickness of, for example, 1000 nm or less, preferably less than 300 nm, more preferably 250 nm or less, even more preferably 200 nm or less, especially preferably 160 nm or less, particularly preferably less than 150 nm, most preferably 148 nm or less. This configuration is suitable for suppressing warpage of the transparent electroconductive film X by reducing a compressive residual stress of the light-transmitting electroconductive film 20.

The light-transmitting electroconductive film 20 has a total light transmittance (JIS K 7375-2008) of preferably 60% or more, more preferably 80% or more, even more preferably 85% or more. This configuration is suitable for ensuring the transparency of the light-transmitting electroconductive film 20. The light-transmitting electroconductive film 20 has a total light transmittance of, for example, 100% or less.

In the present embodiment, the light-transmitting electroconductive film 20 is a crystalline film. That the light-transmitting electroconductive film is a crystalline film can be judged as follows, for example. First, a light-transmitting electroconductive film (in the transparent electroconductive film X, the light-transmitting electroconductive film 20 on the transparent substrate 10) is immersed in hydrochloric acid having a concentration of 5% by mass at 20° C. for 15 minutes. Next, the light-transmitting electroconductive film is washed with water and then dried. Then, in an exposed plane of the light-transmitting electroconductive film (in the transparent electroconductive film X, a surface of the light-transmitting electroconductive film 20 opposite to the transparent substrate 10), a resistance between a pair of terminals (inter-terminal resistance) at a separation distance of 15 mm is measured. In this measurement, when the inter-terminal resistance is 10 kΩ or less, the light-transmitting electroconductive film is a crystalline film. That the light-transmitting electroconductive film is a crystalline film can be judged by observing the presence of crystal grains in the light-transmitting electroconductive film in plane view using a transmission electron microscope.

The light-transmitting electroconductive film 20 (crystalline film) has a specific resistance of preferably $2.2 \times 10^{-4}$ Ω·cm or less, more preferably $2 \times 10^{-4}$ Ω·cm or less, even more preferably $1.9 \times 10^{-4}$ Ω·cm or less, particularly preferably $1.8 \times 10^{-4}$ Ω·cm or less. This configuration is suitable for ensuring the low resistance required for the light-transmitting electroconductive film 20 when the transparent electroconductive film X is provided in a touch sensor device, a light control element, a photoelectric conversion element, a hot wire control member, an antenna member, a heater member, an electromagnetic wave shielding member, an illuminating device, an image display device, and the like. The light-transmitting electroconductive film 20 has a specific resistance of preferably $0.1 \times 10^{-4}$ Ω·cm or more, more preferably $0.5 \times 10^{-4}$ Ω·cm or more, even more preferably $1.0 \times 10^{-4}$ Ω·cm or more.

The specific resistance of the light-transmitting electroconductive film 20 is determined by multiplying the surface resistance of the light-transmitting electroconductive film 20 by the thickness thereof. The specific resistance can be controlled, for example, by adjusting the Kr content ratio in the light-transmitting electroconductive film 20, and by adjusting various conditions for sputtering film formation of the light-transmitting electroconductive film 20. Examples of the conditions include a temperature of a base (transparent substrate 10 in the present embodiment) where the light-transmitting electroconductive film 20 is formed by deposition, an amount of oxygen introduced into the film deposition chamber, an atmospheric pressure in the film deposition chamber, and a horizontal magnetic field intensity on a target.

The transparent electroconductive film X is produced, for example, in the following manner.

Figure 3A:
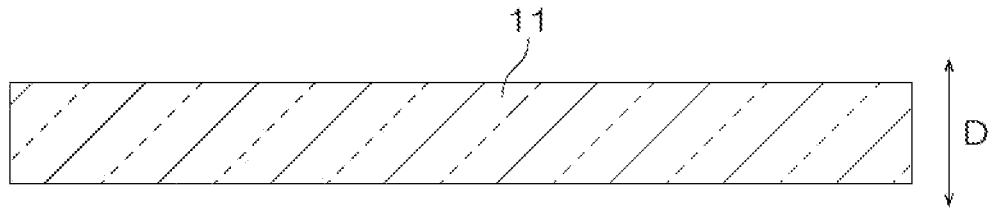
FIGS. 3A to 3D represent a method of producing the transparent electroconductive film shown in FIG. 1.

First, as shown in FIG. 3A, a resin film 11 is prepared.

Figure 3B:
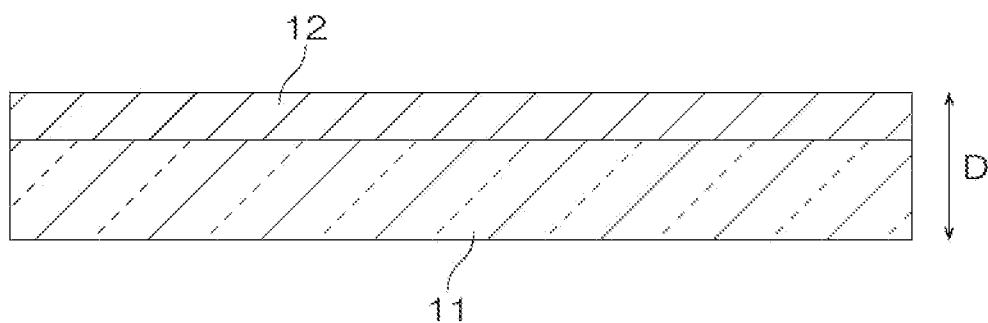

Next, as shown in FIG. 3B, a functional layer 12 is formed on one surface in the thickness direction D of the resin film 11. A transparent substrate 10 is prepared by the formation of the functional layer 12 on the resin film 11.

The above-mentioned functional layer 12 as a hard coat layer can be formed by applying a coating of a curable resin composition onto the resin film 11 to form a coated film, and then curing the coated film. When the curable resin composition contains an ultraviolet curing type resin, the coated film is cured by ultraviolet irradiation. When the curable resin composition contains a thermosetting type resin, the coated film is cured by heating.

The exposed surface of the functional layer 12 formed on the resin film 11 is subjected to surface modification treatment as needed. When plasma treatment is performed as the surface modification treatment, argon gas is used for example as an inert gas. In the plasma treatment, discharge electric power is, for example, 10 W or more and for example, 5000 W or less.

Figure 3C:
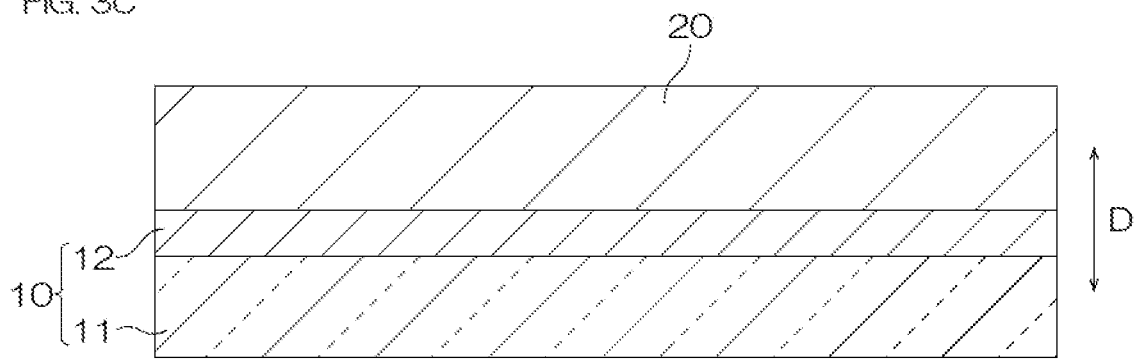

Next, as shown in FIG. 3C, an amorphous light-transmitting electroconductive film 20 is formed on the transparent substrate 10 (film deposition step). Specifically, a film formation material is deposited on the functional layer 12 in the transparent substrate 10 by the sputtering method to form an amorphous light-transmitting electroconductive film 20 (this light-transmitting electroconductive film 20 is converted into a crystalline light-transmitting electroconductive film 20 by heating in a crystallization step to be described later).

In the sputtering method, a sputtering film formation apparatus capable of conducting a film deposition process in a roll-to-roll process is preferably used. In the production of the transparent electroconductive film X, in the case of using the roll-to-roll type sputtering film formation apparatus, while a long transparent substrate 10 is fed from a supply roll to a take-up roll included in the apparatus, a film formation material is deposited on the transparent substrate 10 to form a light-transmitting electroconductive film 20. In the sputtering method, a sputtering film formation apparatus having one film deposition chamber may be used, or a sputtering film formation apparatus having a plurality of film deposition chambers sequentially disposed along a feed path of the transparent substrate 10 may be used (when the light-transmitting electroconductive film 20 including the first region 21 and the second region 22 described above is formed, a sputtering film formation apparatus having two or more film deposition chambers is used).

In the sputtering method, specifically, while a sputtering gas (inert gas) is introduced into a film deposition chamber, which is included in a sputtering film formation apparatus, under vacuum conditions, a negative voltage is applied to a target disposed on a cathode in the film deposition chamber. This generates glow discharge to ionize a gas atom, the gas ion is allowed to collide with the target surface at high speed, a target material is sputtered away from the target surface, and the sputtered target material is deposited on the functional layer 12 of the transparent substrate 10.

As the material of the target disposed on the cathode in the film deposition chamber, the electroconductive oxide, described above regarding the light-transmitting electroconductive film 20, is used, an indium-containing electroconductive oxide is preferably used, and an ITO is more preferably used. When an ITO is used, the ratio of the content of tin oxide ($SnO_2$) to the total content of tin oxide and indium oxide in the ITO, preferably 0.1% by mass or more, more preferably 1% by mass or more, even more preferably 3% by mass or more, further preferably 5% by mass or more, particularly preferably 7% by mass or more, and preferably 15% by mass or less, more preferably 13% by mass or less, even more preferably 12% by mass or less.

The sputtering method is preferably a reactive sputtering method. In the reactive sputtering method, a reactive gas, in addition to the sputtering gas, is introduced into the film deposition chamber.

When the light-transmitting electroconductive film 20 containing Kr entirely over the thickness direction D is formed (in a first case), the gas introduced into one, or two or more film deposition chambers included in the sputtering film formation apparatus contains Kr as the sputtering gas and oxygen as the reactive gas. The sputtering gas may contain an inert gas other than Kr. Examples of the inert gas other than Kr include a rare gas atom other than Kr. Examples of the rare gas atom include Ar and Xe. The content ratio of Kr in the gas introduced into the film deposition chamber is, preferably, 50% by volume or more, more preferably 60% by volume or more, even more preferably 70% by volume or more, and for example, 100% by volume or less.

When the light-transmitting electroconductive film 20 including the first region 21 and the second region 22 described above is formed (in a second case), the gas introduced into a film deposition chamber for forming the first region 21 contains Kr as the sputtering gas and oxygen as the reactive gas. The sputtering gas may contain an inert gas other than Kr. The kind of the inert gas other than Kr is the same as described above in the first case. The content ratio of Kr in the gas introduced into the film deposition chamber is, preferably, 50% by volume or more, more preferably 60% by volume or more, even more preferably 70% by volume or more, and for example, 100% by volume or less.

In the above-mentioned second case, the gas introduced into a film deposition chamber for forming the second region 22 contains an inert gas other than Kr as the sputtering gas and oxygen as the reactive gas. Examples of the inert gas other than Kr include the above-mentioned inert gas as the inert gas other than Kr in the first case, and preferably Ar is used.

In the reactive sputtering method, the ratio of the amount of the sputtering gas introduced with respect to the total amount of the sputtering gas and oxygen introduced into the film deposition chamber is, for example, 85 flow rate % or more and for example, 99.99 flow rate % or less. The ratio of the amount of oxygen introduced with respect to the total amount of the sputtering gas and oxygen introduced into the film deposition chamber is, for example, 0.01 flow rate % or more and for example, 15 flow rate % or less.

The atmospheric pressure in the film deposition chamber during film deposition by the sputtering method (sputtering film formation) is, for example, 0.02 Pa or more and for example, 1 Pa or less.

The temperature of the transparent substrate 10 during sputtering film formation is, for example, 100° C. or less, preferably 50° C. or less, more preferably 30° C. or less, even more preferably 10° C. or less, particularly preferably 0° C. or less and for example, −50° C. or more, preferably −20° C. or more, more preferably −10° C. or more, even more preferably −7° C. or more.

Examples of a power source for applying a voltage to the target include a DC power source, an AC power source, an MF power source, and an RF power source. As the power source, a DC power source and an RF power source may be used in combination. An absolute value of a discharge voltage during sputtering film formation is, for example, 50 V or more and for example, 500 V or less. The target has a horizontal magnetic field intensity of, for example, 10 mT or more, preferably 60 mT or more, and for example, 300 mT or less, on its surface. This configuration is preferred for suppressing an excessive amount of a krypton atom in the light-transmitting electroconductive film 20 and therefore, is preferred for suppressing the yellowish tint and reducing resistance of the light-transmitting electroconductive film 20 thus formed.

Figure 3D:
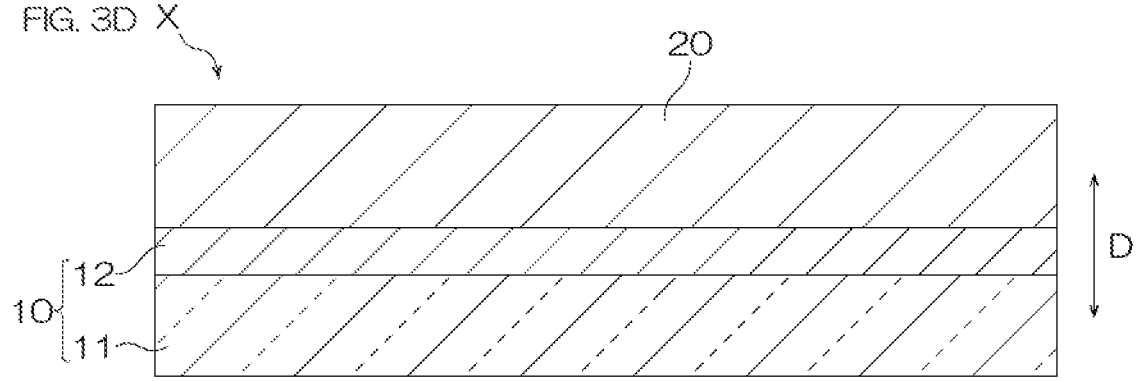

In the production method, next, as shown in FIG. 3D, the light-transmitting electroconductive film 20 is converted (crystallized) from amorphous to crystalline by heating (crystallization step). Examples of the heating means include an infrared heater, and an oven such as a heat-medium heating oven and a hot-air heating oven. The environment during heating may be either a vacuum environment or an atmospheric environment. Preferably, heating is performed in the presence of oxygen. The heating temperature is, for example, 100° C. or more, preferably 120° C. or more, in view of ensuring a high crystallization rate. The heating temperature is, for example, 200° C. or less, preferably 180° C. or less, more preferably 170° C. or less, even more preferably 165° C. or less, in view of suppressing the heating effect on the transparent substrate 10. The heating time is, for example, 10 hours or less, preferably 200 minutes or less, more preferably 90 minutes or less, even more preferably 60 minutes or less, and for example, 1 minute or more, preferably 5 minutes or more.

As described above, the transparent electroconductive film X is produced.

The light-transmitting electroconductive film 20 of the transparent electroconductive film X may be patterned as schematically shown in FIG. 4. The light-transmitting electroconductive film 20 can be patterned by etching the light-transmitting electroconductive film 20 through a predetermined etching mask. The patterning of the light-transmitting electroconductive film 20 may be performed before the crystallization step described above or after the crystallization step. The patterned light-transmitting electroconductive film 20 serves as a wiring pattern, for example.

Since the light-transmitting electroconductive film 20 of the transparent electroconductive film X includes a region containing krypton at a content ratio of less than 0.1 atomic % at least partially in the thickness direction, it is suitable for reducing resistance and suppressing the yellowish tint. The transparent electroconductive film X includes such light-transmitting electroconductive film 20, so that it is suitable for reducing resistance and suppressing the yellowish tint. Examples and Comparative Examples below specifically show these facts.

In the transparent electroconductive film X, the functional layer 12 may be an adhesion improving layer for achieving high adhesion of the light-transmitting electroconductive film 20 to the transparent substrate 10. The configuration in which the functional layer 12 is an adhesion improving layer is suitable for ensuring an adhesive force between the transparent substrate 10 and the light-transmitting electroconductive film 20.

The functional layer 12 may be an index-matching layer for adjusting a reflection coefficient of the surface (one surface in the thickness direction D) of the transparent substrate 10. When the light-transmitting electroconductive film 20 is patterned on the transparent substrate 10, the configuration in which the functional layer 12 is an index-matching layer is suitable for making it difficult to visually recognize the pattern shape of the light-transmitting electroconductive film 20.

The functional layer 12 may be a peel functional layer for allowing the light-transmitting electroconductive film 20 to be practically peeled off from the transparent substrate 10. The configuration in which the functional layer 12 is a peel functional layer is suitable for peeling off the light-transmitting electroconductive film 20 from the transparent substrate 10 and transferring the light-transmitting electroconductive film 20 to another member.

The functional layer 12 may be a composite layer in which a plurality of layers are continuous in the thickness direction D. The composite layer preferably includes two or more layers selected from the group consisting of a hard coat layer, an adhesion improving layer, an index-matching layer, and a peel functional layer. This configuration is suitable for exhibiting the above-described functions of the selected layers in the functional layer 12 in a composite manner. In a preferred embodiment, the functional layer 12 includes an adhesion improving layer, a hard coat layer, an index-matching layer in this order toward one side of the thickness direction D on the resin film 11. In another preferred embodiment, the functional layer 12 includes a peel functional layer, a hard coat layer, an index-matching layer in this order toward one side of the thickness direction D on the resin film 11.

The transparent electroconductive film X is used in a state where the film X is fixed to an article and the light-transmitting electroconductive film 20 is patterned as needed. The transparent electroconductive film X is bonded to an article with, for example, a fixing functional layer interposed therebetween.

Examples of the article include an element, a member, and a device. That is, examples of the article with the transparent electroconductive film include an element with a transparent electroconductive film, a member with a transparent electroconductive film, and a device with a transparent electroconductive film.

Examples of the element include a light control element and a photoelectric conversion element. Examples of the light control element include a current driven-type light control element and an electric field driven-type light control element. Examples of the current driven-type light control element include an electrochromic (EC) light control element. Examples of the electric field driven-type light control element include a polymer dispersed liquid crystal (PDLC) light control element, a polymer network liquid crystal (PNLC) light control element, and a suspended particle device (SPD) light control element. Example of the photoelectric conversion element includes a solar cell. Examples of the solar cell include an organic thin film solar cell and a dye-sensitized solar cell. Examples of the member include an electromagnetic wave shielding member, a hot wire control member, a heater member, and an antenna member. Examples of the device include a touch sensor device, an illuminating device, and an image display device.

The article with the transparent electroconductive film is suitable for enhancing performance of a function that is dependent on the light transmittivity and electroconductivity of the light-transmitting electroconductive film 20 because the light-transmitting electroconductive film 20 of the transparent electroconductive film X included in such article is suitable for reducing resistance. The article with the transparent electroconductive film is also suitable for ensuring good appearance because the light-transmitting electroconductive film 20 of the transparent electroconductive film X included in such article is suitable for suppressing the yellowish tint.

Examples of the fixing functional layer described above include an adhesive layer and a bonding layer. As a material of the fixing functional layer, any material can be used without particular limitation as long as it has transparency and exhibits the fixing function. The fixing functional layer is preferably formed of resin. Examples of the resin include acrylic resin, silicone resin, polyester resin, polyurethane resin, polyamide resin, polyvinyl ether resin, vinyl acetate/vinyl chloride copolymer, modified polyolefin resin, epoxy resin, fluorine resin, natural rubber, and synthetic rubber. As the above-mentioned resin, acrylic resin is preferred because it shows adhesive properties such as cohesiveness, tackiness, and moderate wettability; excellent in transparency; and excellent in weather resistance and heat resistance.

The fixing functional layer (fixing functional layer forming resin) may be mixed with a corrosion inhibitor in order to inhibit corrosion of the light-transmitting electroconductive film 20. The fixing functional layer (fixing functional layer forming resin) may be mixed with a migration inhibitor (e.g., material disclosed in Japanese Unexamined Patent Publication No. 2015-022397) in order to inhibit migration of the light-transmitting electroconductive film 20. The fixing functional layer (fixing functional layer forming resin) may also be mixed with an ultraviolet absorber in order to suppress deterioration of the article when used outdoors. Examples of the ultraviolet absorber include a benzophenone compound, a benzotriazole compound, a salicylic acid compound, an anilide oxalate compound, a cyanoacrylate compound, and a triazine compound.

When the transparent substrate 10 of the transparent electroconductive film X is fixed to the article with the fixing functional layer interposed therebetween, the light-transmitting electroconductive film 20 (including the patterned light-transmitting electroconductive film 20) is exposed in the transparent electroconductive film X. In this case, a cover layer may be disposed on the exposed surface of the light-transmitting electroconductive film 20. The cover layer is a layer that covers the light-transmitting electroconductive film 20, and is capable of improving reliability of the light-transmitting electroconductive film 20 and suppressing functional deterioration due to damage of the light-transmitting electroconductive film 20. Such a cover layer is preferably formed of a dielectric material, more preferably a composite material of a resin and an inorganic material. Examples of the resin include the above-mentioned resins for the fixing functional layer. Examples of the inorganic material include inorganic oxide and fluoride. Examples of the inorganic oxide include silicon oxide, titanium oxide, niobium oxide, aluminum oxide, zirconium dioxide, and calcium oxide. Examples of the fluoride includes magnesium fluoride. The cover layer (mixture of the resin and the inorganic material) may be mixed with the corrosion inhibitor, migration inhibitor, or ultraviolet absorber described above.

EXAMPLE

In the following, the present invention will be described specifically based on Examples. The present invention is not limited by Examples. The specific numeral values described below, such as mixing ratios (contents), physical property values, and parameters can be replaced with the corresponding mixing ratios (contents), physical property values, and parameters in the above-described "DESCRIPTION OF THE EMBODIMENTS", including the upper limit values (numeral values defined with "or less", and "less than") or the lower limit values (numeral values defined with "or more", and "more than").

Example 1

An ultraviolet curable resin containing acrylic resin was applied to one surface of a long PET film (50 μm thick, manufactured by Toray Industries, Inc.) as a resin film to form a coated film. Subsequently, the coated film was cured by ultraviolet irradiation to form a hard coat layer (2 μm thick). In this manner, a transparent substrate including the resin film and the hard coat layer as a functional layer was prepared.

Next, an amorphous light-transmitting electroconductive film having a thickness of 30 nm was formed on the hard coat layer of the transparent substrate by a reactive sputtering method. In the reactive sputtering method, a sputtering film formation apparatus (DC magnetron sputtering apparatus) capable of conducting a film deposition process in a roll-to-roll system was used. Sputtering film formation conditions in this Example are as follows.

Figure 5:
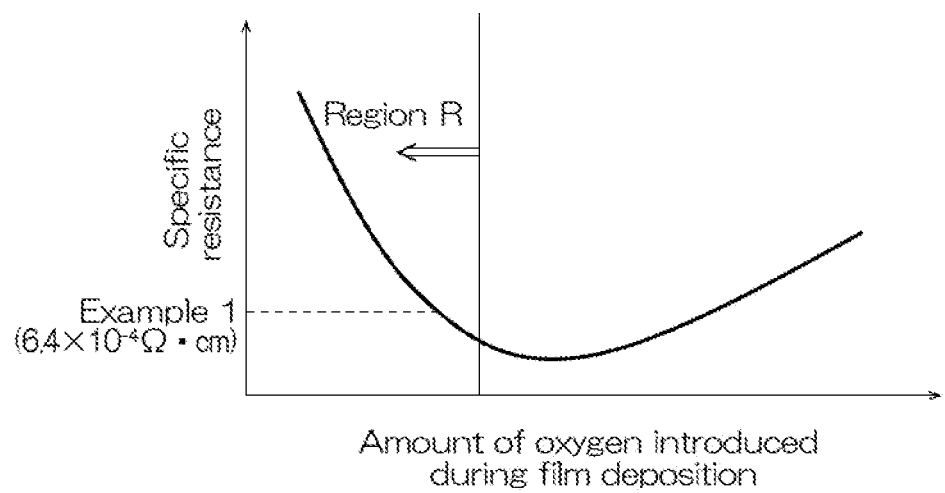
FIG. 5 is a graph showing a relationship between an amount of oxygen introduced when the light-transmitting electroconductive film is formed by a sputtering method and a specific resistance of the formed light-transmitting electroconductive film.

As a target, a sintered body of indium oxide and tin oxide (with a tin oxide concentration of 10% by mass) was used. As a power source for applying a voltage to the target, a DC power source was used (with a horizontal magnetic field intensity of 90 mT on the target). A film deposition temperature (temperature of the transparent substrate having the light-transmitting electroconductive film laminated thereon) was −5° C. A film deposition chamber included in the apparatus was vacuum-evacuated internally to an ultimate degree of vacuum of $0.7 \times 10^{-4}$ Pa, and Kr as a sputtering gas and oxygen as a reactive gas were then introduced into the film deposition chamber, so that the atmospheric pressure in the film deposition chamber was 0.3 Pa. A ratio of an amount of oxygen introduced with respect to the total amount of Kr and oxygen introduced into the film deposition chamber was about 2.6 flow rate %, and the amount of oxygen introduced was within a region R of a specific resistance-oxygen introduced amount curve as shown in FIG. 5, and was adjusted so that a formed film had a specific resistance value of $6.4 \times 10^{-4}$ Ω·cm. The specific resistance-oxygen introduced amount curve shown in FIG. 5 can be previously prepared by investigating the dependence of the specific resistance of the light-transmitting electroconductive film on the amount of oxygen introduced when the light-transmitting electroconductive film is formed by the reactive sputtering method under the same conditions as above other than the amount of oxygen introduced.

Next, the light-transmitting electroconductive film on the transparent substrate was crystallized by heating in a hot-air oven (crystallization step). In this step, the heating temperature was 165° C. and the heating time was 1 hour.

As described above, a transparent electroconductive film of Example 1 was prepared. The light-transmitting electroconductive film (30 nm thick, crystalline) of the transparent electroconductive film of Example 1 was made of a single Kr-containing ITO layer.

Example 2

A transparent electroconductive film of Example 2 was prepared in the same manner as the transparent electroconductive film of Example 1 except the following.

In the formation of a light-transmitting electroconductive film, a first sputtering film formation in which a first region (28 nm thick) of the light-transmitting electroconductive film was formed on the transparent substrate, and a second sputtering film formation in which a second region (102 nm thick) of the light-transmitting electroconductive film was formed on the first region were sequentially performed.

The first sputtering film formation conditions in this Example are as follows. As the target, a sintered body of indium oxide and tin oxide (with a tin oxide concentration of 10% by mass) was used. As a power source for applying a voltage to the target, a DC power source was used (with a horizontal magnetic field intensity of 90 mT on the target). The film deposition temperature was −5° C. A first film deposition chamber included in the apparatus was vacuum-evacuated internally to an ultimate degree of vacuum of $0.7 \times 10^{-4}$ Pa, and Kr as the sputtering gas and oxygen as the reactive gas were then introduced into the film deposition chamber, so that the atmospheric pressure in the film deposition chamber was 0.2 Pa. The amount of oxygen introduced into the film deposition chamber was adjusted so that a formed film had a specific resistance value of $6.4 \times 10^{-4}$ Ω·cm.

The second sputtering film formation conditions in this Example are as follows. A second film deposition chamber included in the apparatus was vacuum-evacuated internally to an ultimate degree of vacuum of $0.7 \times 10^{-4}$ Pa, and Ar as the sputtering gas and oxygen as the reactive gas were then introduced into the film deposition chamber, so that the atmospheric pressure in the film deposition chamber was 0.4 Pa. In this Example, the other conditions in the second sputtering film formation were the same as those in the first sputtering film formation.

As described above, the transparent electroconductive film of Example 2 was prepared. The light-transmitting electroconductive film (130 nm thick, crystalline) of the transparent electroconductive film of Example 2 had a first region (28 nm thick) made of a Kr-containing ITO layer and a second region (102 nm thick) made of an Ar-containing ITO layer in order from the transparent substrate side.

Example 3

A transparent electroconductive film of Example 3 was prepared in the same manner as the transparent electroconductive film of Example 1 except the following in the sputtering film formation. As the sputtering gas, a gas mixture of krypton and argon (90% by volume of Kr, 10% by volume of Ar) was used. The atmospheric pressure in the film deposition chamber was 0.2 Pa.

The light-transmitting electroconductive film (30 nm thick, crystalline) of the transparent electroconductive film of Example 3 was made of a single ITO layer containing Kr and Ar.

Comparative Example 1

A transparent electroconductive film of Comparative Example 1 was prepared in the same manner as the transparent electroconductive film of Example 1 except the following.

In the sputtering film formation, Ar was used as the sputtering gas, and a light-transmitting electroconductive film having a thickness of 130 nm was deposited.

The light-transmitting electroconductive film (130 nm thick) of the transparent electroconductive film of Comparative Example 1 was made of a single Ar-containing ITO layer.

Comparative Example 2

A light-transmitting electroconductive film was formed in the same manner as in Example 1, except that Ar was used as the sputtering gas in the sputtering film formation. The light-transmitting electroconductive film (30 nm thick) of the transparent electroconductive film of Comparative Example 2 was made of a single Ar-containing ITO layer.

<Thickness of Light-Transmitting Electroconductive Film>

The thickness of each of the light-transmitting electroconductive films of Examples 1 to 3 and Comparative Examples 1 and 2 was measured by FE-TEM observation. Specifically, first, a sample for cross-section observation of each of the light-transmitting electroconductive films of Examples 1 and 3 and Comparative Examples 1 and 2 was prepared by an FIB micro-sampling method. In the FIB micro-sampling method, an FIB device (trade name "FB2200" manufactured by Hitachi Ltd.) was used and the accelerating voltage was set to 10 kV. Next, the thickness of the light-transmitting electroconductive film in the sample for cross-section observation was measured by FE-TEM observation. In the FE-TEM observation, an FE-TEM device (trade name "JEM-2800" manufactured by JEOL Ltd.) was used and the accelerating voltage was set to 200 kV.

Regarding Example 2, a sample for cross-section observation was prepared from an intermediate prepared before the second region was formed on the first region, and the thickness of the first region of the light-transmitting electroconductive film was measured by the FE-TEM observation of the sample. The thickness of the second region of the light-transmitting electroconductive film of Example 2 was determined by subtracting the thickness of the first region from the total thickness of the light-transmitting electroconductive film of Example 2.

<Specific Resistance>

The specific resistance of the light-transmitting electroconductive film of each of the transparent electroconductive films of Examples 1 to 3 and Comparative Examples 1 and 2 was investigated. Specifically, first, the surface resistance of the light-transmitting electroconductive film of the transparent electroconductive film was measured by a four-terminal method according to JIS K 7194 (1994). Then, the specific resistance (Ω·cm) was determined by multiplying the surface resistance value by the thickness of the light-transmitting electroconductive film. The results are shown in Table 1.

<Evaluation of Yellowish Tint>

The yellowish tint of the light-transmitting electroconductive film of each of the transparent electroconductive films of Examples 1 to 3 and Comparative Examples 1 and 2 was examined. Specifically, b* (in the L*a*b* table color system) of the transmitted color of the transparent electroconductive film was measured by an integrating-sphere spectral transmittance meter (device name "DOT-3C", manufactured by Murakami Color Research Laboratory Instruments) (smaller b* values indicate less yellowish hue).

In this measurement, a D65 light source was used as the light source. The results of this measurement are shown in Table 1.

<Quantitative Analysis of Rare Gas Atom in Light-Transmitting Electroconductive Film>

The contents of Kr and Ar atoms in the light-transmitting electroconductive films of Examples 1 and 3 and Comparative Examples 1 and 2 were analyzed by Rutherford backscattering spectrometry (RBS). The proportions of five elements including In+Sn (in RBS, it was difficult to measure In and Sn separately, so that the two elements were evaluated in combination), O, Ar, and Kr, which were detected elements, were determined to thereby determine the amounts (atomic %) of the Kr atom and the Ar atom present in the light-transmitting electroconductive film. The use device and the measurement conditions are as follows. As the analysis results, the Kr content (atomic %) and the Ar content (atomic %) are shown in Table 1. For the analysis of the Kr content, a certain measurement value of not less than the detection limit value (lower limit) failed to be obtained in Examples 1 and 3 (the detection limit value varies depending on the thickness of the light-transmitting electroconductive film to be measured, and for the thickness of the light-transmitting electroconductive film of Example 1, the detection limit value is 0.10 atomic %). Therefore, in Table 1, the Kr content in the light-transmitting electroconductive film is denoted as "<0.10" to indicate that it is below the detection limit value.

In Example 2, in order to specify the content of the Kr atom, a sample for Kr content measurement was prepared from an intermediate prepared before the second region was formed on the first region of the light-transmitting electroconductive film, and the Kr content was determined in the same manner as in Examples 1 and 3. However, since the Kr content was less than the detection lower limit as in Examples 1 and 3, it is denoted as "<0.10" to indicate that the Kr content is less than the detection limit value (0.10) for the thickness of the light-transmitting electroconductive film as the first region. Further, the content of the Ar atom in the second region was determined in the same manner as in Examples 1 and 3 and Comparative Examples 1 and 2, using the light-transmitting electroconductive film (130 nm thick) made of a laminate of the first region and the second region as a specimen.

<Use Device>
Pelletron 3SDH (manufactured by National Electrostatics Corporation)

<Measurement Conditions>
Incident ion: $^4He^{++}$
Incident energy: 2300 keV
Incident angle: 0 deg.
Scattering angle: 160 deg.
Sample current: 6 nA
Beam diameter: 2 mmφ
In-plane rotation: Nil
Irradiation dose: 75 μC <Confirmation of Kr Atom in Light-Transmitting Electroconductive Film>

Whether each of the light-transmitting electroconductive films in Examples 1 to 3 contained Kr atoms was confirmed as follows. First, using a scanning X-ray fluorescence spectrometer (trade name "ZSX Primus IV" manufactured by Rigaku Corporation), X-ray fluorescence analysis measurement was repeated 5 times under the following measurement conditions, an average value of the scan angles was calculated, and an X-ray spectrum was generated. It was then confirmed that a peak appeared near a scan angle of 28.2° in the generated X-ray spectrum, thereby confirming that Kr atoms were contained in the light-transmitting electroconductive film.

<Measurement Conditions>
Spectrum: Kr-KA
Measurement diameter: 30 mm
Atmosphere: Vacuum
Target: Rh
Tube voltage: 50 kV
Tube current: 60 mA
Primary filter: Ni40
Scan angle (deg.): 27.0 to 29.5
Step (deg.): 0.020
Speed (deg/min): 0.75
Attenuator: 1/1
Slit: S2
Analyzing crystal: LiF (200)
Detector: SC
PHA: 100 to 300

TABLE 1

| | Light-transmitting electroconductive film | | | | | |
|---|---|---|---|---|---|---|
| | Thickness (nm) | Kr content (at %) | Ar content (at %) | Content of rare gas atom (at %) | Transmitted hue b* | Specific resistance (×10⁻⁴ Ω · cm) |
| Example 1 | 30 | <0.10 | — | <0.10 | 2.96 | 1.5 |
| Example 2 | 102 [Second region] | — | 0.14 | <0.24 | 2.80 | 1.8 |
| | 28 [First region] | <0.10 | — | | | |
| Example 3 | 30 | <0.10 | 0.04 | <0.14 | 3.01 | 1.6 |
| Comparative Example 1 | 130 | — | 0.14 | 0.14 | 3.43 | 2.3 |
| Comparative Example 2 | 30 | — | 0.14 | 0.14 | 3.11 | 1.9 |

[Evaluation]

In the transparent electroconductive films of Examples 1 to 3, the light-transmitting electroconductive film contains Kr. Such light-transmitting electroconductive film has a lower specific resistance than the light-transmitting electroconductive films (not containing Kr) of Comparative Examples 1 and 2.

In addition, in the transparent electroconductive films of Examples 1 to 3, the light-transmitting electroconductive film has a Kr content of less than 0.1 atomic %. The transparent electroconductive film including such light-transmitting electroconductive film has a smaller b* value than the transparent electroconductive films of Comparative Examples 1 and 2, and thus, a yellowish tint is suppressed. Specific details are as follows.

In the transparent electroconductive films of Examples 1 to 3 and Comparative Examples 1 and 2, the b* value of the transparent color depends on the thickness of the light-transmitting electroconductive film (all the transparent electroconductive films have the same b* value of the transmitted color of the transparent substrate). Regarding the transparent electroconductive films of Examples 1 and 3 and of Comparative Example 2 in which the light-transmitting electroconductive films have the same thickness, the transparent electroconductive films of Examples 1 and 3 have a smaller b* value than the transparent electroconductive film of Comparative Example 2, so that the yellowish tint is suppressed. That is, the light-transmitting electroconductive films in Examples 1 and 3 have a yellowish tint suppressed more than the light-transmitting electroconductive film in Comparative Example 2. Regarding the transparent electroconductive films of Example 2 and of Comparative Example 1 in which the light-transmitting electroconductive films have the same thickness, the transparent electroconductive film of Example 2 has a smaller b* value than the transparent electroconductive film of Comparative Example 1, so that a yellowish tint is suppressed. That is, the light-transmitting electroconductive film in Example 2 has a yellowish tint suppressed more than the light-transmitting electroconductive film in Comparative Example 1.

INDUSTRIAL APPLICABILITY

The light-transmitting electroconductive film of the present invention can be used as, for example, an electroconductive film for forming a pattern of a transparent electrode in various devices such as a liquid crystal display, a touch panel, and an optical sensor. The transparent electroconductive film of the present invention can be used as a supply of such electroconductive film.

DESCRIPTION OF REFERENCE NUMERALS

X transparent electroconductive film
D thickness direction
10 transparent substrate
11 resin film
12 functional layer
20 light-transmitting electroconductive film

The invention claimed is:

1. A light-transmitting electroconductive film having a thickness, and
   comprising a region containing krypton at a content ratio of less than 0.1 atomic % at least partially in the thickness direction.

2. The light-transmitting electroconductive film according to claim 1, containing krypton at a content ratio of less than 0.1 atomic % over an entire region in the thickness direction.

3. The light-transmitting electroconductive film according to claim 1, comprising a region containing no krypton at least partially in the thickness direction.

4. The light-transmitting electroconductive film according to claim 3, wherein the region containing no krypton contains argon.

5. The light-transmitting electroconductive film according to claim 1, wherein the light-transmitting electroconductive film is patterned.

6. A transparent electroconductive film comprising:
   a transparent substrate; and
   a light-transmitting electroconductive film according to claim 1 disposed on one surface side in a thickness direction of the transparent substrate.

* * * * *